US009656346B2

(12) United States Patent
Yeh

(10) Patent No.: US 9,656,346 B2
(45) Date of Patent: May 23, 2017

(54) DEVICE AND METHOD FOR LASER PROCESSING OF LARGE-AREA SUBSTRATES USING AT LEAST TWO BRIDGES

(71) Applicant: SAINT-GOBAIN GLASS FRANCE, Courbevoie (FR)

(72) Inventor: Li-Ya Yeh, Geilenkirchen (DE)

(73) Assignee: SAINT-GOBAIN GLASS FRANCE, Courbevoie (FR)

( * ) Notice: Subject to any disclaimer, the term of this patent is extended or adjusted under 35 U.S.C. 154(b) by 0 days.

(21) Appl. No.: 14/408,564

(22) PCT Filed: May 17, 2013

(86) PCT No.: PCT/EP2013/060247
§ 371 (c)(1),
(2) Date: Dec. 16, 2014

(87) PCT Pub. No.: WO2014/005755
PCT Pub. Date: Jan. 9, 2014

(65) Prior Publication Data
US 2015/0290740 A1    Oct. 15, 2015

(30) Foreign Application Priority Data
Jul. 4, 2012    (EP) .................................... 12174902

(51) Int. Cl.
*B23K 26/08*    (2014.01)
*B23K 26/00*    (2014.01)
(Continued)

(52) U.S. Cl.
CPC ...... *B23K 26/0066* (2013.01); *B23K 26/0673* (2013.01); *B23K 26/0738* (2013.01);
(Continued)

(58) Field of Classification Search
CPC ............ B23K 26/0051; B23K 26/0066; B23K 26/0673; B23K 26/0738; B23K 26/0815;
(Continued)

(56) References Cited

U.S. PATENT DOCUMENTS 4,889,140 A    12/1989    Lorenzen et al.
4,987,286 A *   1/1991    Allen .................. B23K 26/362
                                                    219/121.84

(Continued)

FOREIGN PATENT DOCUMENTS

CN    1610061 A    4/2005
CN    1921069 A    2/2007
(Continued)

OTHER PUBLICATIONS

Machine translation of Germany Patent document No. 19620391, May 2016.*

(Continued)

*Primary Examiner* — Geoffrey S Evans
(74) *Attorney, Agent, or Firm* — Steinfl + Bruno LLP

(57) ABSTRACT

Laser device for tempering metal-containing or metal-oxide-containing coatings on large-area glass substrates having at least: a) at least one laser source, b) at least two bridges spanning a conveyor belt with the glass substrate, wherein each bridge contains a plurality of optical arrangements, which are alternatingly arranged on the bridges, each optical arrangement generates a laser line, and the laser lines of all optical arrangements together cover the entire width of the glass substrate.

18 Claims, 10 Drawing Sheets

Figure 1A:
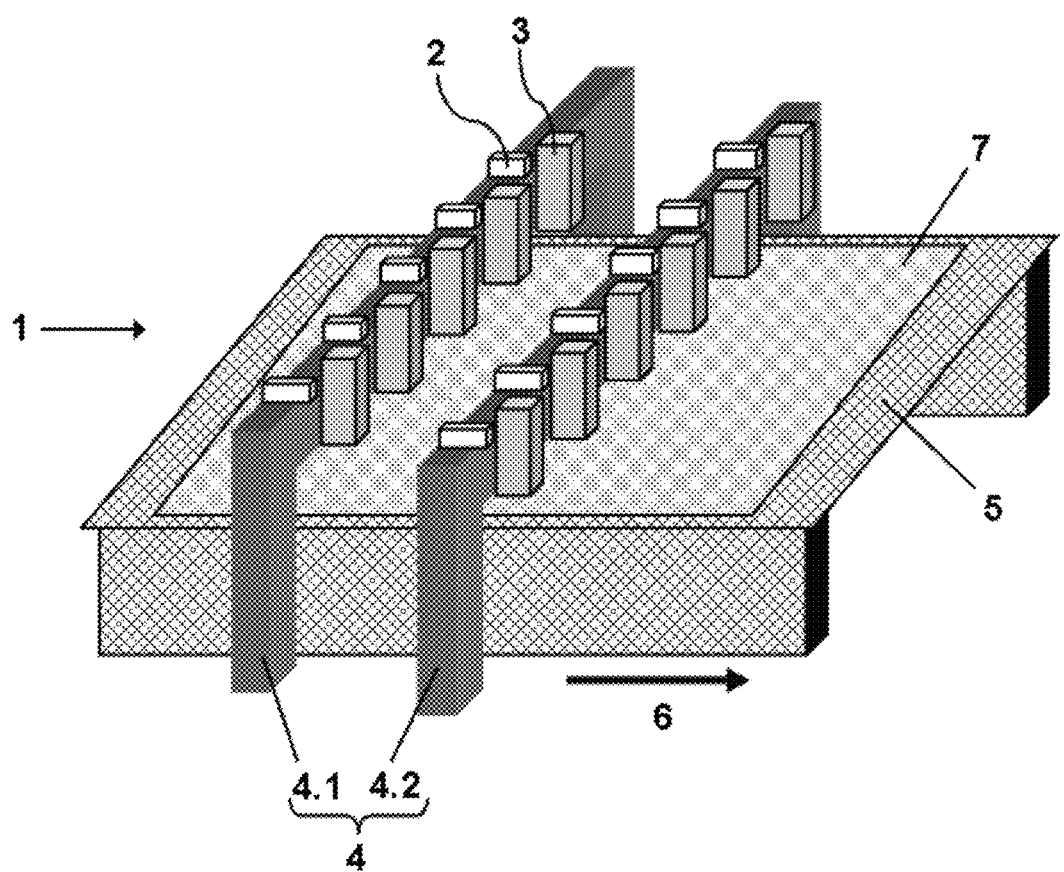

(51) Int. Cl.
*B23K 37/02* (2006.01)
*B23K 26/067* (2006.01)
*B23K 26/073* (2006.01)
*B23K 26/082* (2014.01)
*C23C 14/58* (2006.01)
*B23K 101/40* (2006.01)

(52) U.S. Cl.
CPC ........ *B23K 26/082* (2015.10); *B23K 26/0838* (2013.01); *B23K 26/0846* (2013.01); *B23K 37/0235* (2013.01); *C23C 14/5813* (2013.01); *B23K 2201/40* (2013.01)

(58) Field of Classification Search
CPC .............. B23K 26/082; B23K 26/0838; B23K 26/0846; B23K 37/0235; B23K 2201/40; C23C 14/5813
See application file for complete search history.

(56) References Cited

U.S. PATENT DOCUMENTS

| | | | | |
|---|---|---|---|---|
| 6,281,470 | B1* | 8/2001 | Adachi | H01L 21/2026 219/121.62 |
| 6,365,870 | B1 | 4/2002 | Petring et al. | |
| 6,884,699 | B1* | 4/2005 | Ogawa | B23K 26/0838 438/487 |
| 7,858,193 | B2 | 12/2010 | Ihlo et al. | |
| 2002/0132402 | A1* | 9/2002 | Tanaka | B23K 26/0604 438/166 |
| 2002/0192473 | A1 | 12/2002 | Gentilhomme et al. | |
| 2003/0196995 | A1* | 10/2003 | Jennings | B23K 26/03 219/121.73 |
| 2004/0065643 | A1 | 4/2004 | Tanaka | |
| 2005/0139830 | A1 | 6/2005 | Takeda et al. | |
| 2006/0252261 | A1* | 11/2006 | Tanaka | B23K 26/04 438/662 |
| 2007/0138151 | A1* | 6/2007 | Tanaka | B23K 26/066 219/121.65 |
| 2007/0211323 | A1 | 9/2007 | Jung et al. | |
| 2008/0088900 | A1* | 4/2008 | Hie | B23K 26/0736 359/201.1 |
| 2008/0132041 | A1* | 6/2008 | Yamazaki | B23K 26/0604 438/487 |
| 2009/0197077 | A1 | 8/2009 | Reutler et al. | |
| 2009/0212033 | A1 | 8/2009 | Beck | |
| 2010/0071810 | A1 | 3/2010 | Nadaud et al. | |
| 2010/0252543 | A1* | 10/2010 | Manens | B23K 26/082 219/121.69 |
| 2010/0314367 | A1* | 12/2010 | Shamoun | B23K 26/03 219/121.72 |
| 2011/0139755 | A1* | 6/2011 | Manens | B23K 26/0676 219/121.67 |
| 2012/0145229 | A1* | 6/2012 | Ji | B23K 26/0604 136/252 |
| 2013/0161510 | A1* | 6/2013 | O'Connor | H01J 49/04 250/492.1 |

FOREIGN PATENT DOCUMENTS

| | | |
|---|---|---|
| DE | 4314601 | 10/1994 |
| DE | 19620391 | 11/1997 |
| DE | 19620391 A1 * | 11/1997 |
| DE | 19927683 | 1/2001 |
| DE | 102009006062 | 7/2010 |
| EP | 0912455 | 5/1999 |
| EP | 1218307 | 7/2002 |
| EP | 1917222 | 5/2008 |
| JP | 03-138092 A * | 6/1991 |
| JP | 2004146823 A | 5/2004 |
| JP | 2010514666 A | 5/2010 |
| JP | 2010214421 A | 9/2010 |
| WO | 9748649 | 12/1997 |
| WO | 2007101964 | 9/2007 |
| WO | 2008096089 | 8/2008 |
| WO | WO-2010/105382 A1 * | 9/2010 |

OTHER PUBLICATIONS

Written Opinion for PCT/EP2013/060247 filed on May 17, 2013 in the name of Saint-Gobain Glass France: mailed on Jul. 9, 2013.
PCT International Search Report mailed on Aug. 21, 2012 for PCT/EP2013/060247 filed on May 17, 2013 in the name of Saint-Gobain Glass France.

* cited by examiner

DEVICE AND METHOD FOR LASER PROCESSING OF LARGE-AREA SUBSTRATES USING AT LEAST TWO BRIDGES

CROSS REFERENCE TO RELATED APPLICATIONS

The present application is the US national stage of International Patent Application PCT/EP2013/060247 filed internationally on May 17, 2013 which, in turn, claims priority to European Patent Application No. EP12174902.2 filed on Jul. 4, 2012.

The present invention relates to a method and a device for processing of large-area substrates using laser radiation.

Modern architecture frequently uses large-area windows or glass façades, which yield an aesthetically attractive impression, produce a comfortable indoor climate, and also ensure adequate entry of daylight in the winter. However, particularly in the summer, the infrared portion of sunlight effects strong heating of the living spaces, with window areas with large light entry areas proving to be disadvantageous. Here, darkening arrangements such as blinds or the installation of an air-conditioning system can provide a remedy. However, strong heating of the spaces results in high energy consumption of the air-conditioning system and also, associated therewith, in an increased emission of greenhouse gases.

So-called low-E coatings are an effective possibility of shielding against infrared radiation even before entry into the living space and enabling passage of daylight at the same time. Low-E coatings are thermal radiation reflecting coatings, which reflect a significant part of infrared radiation, which results, in the summer, in a reduced heating of the living spaces. Moreover, the loss of thermal radiation out of the interior space can be reduced if the coating is applied on the inward facing side of the pane. The coating thus also contributes to the insulation of the living space.

Low-E coatings customarily include a diffusion barrier, a metal-containing or metal-oxide-containing multilayer, and a barrier layer. The diffusion barrier is applied directly on the glass surface and prevents discoloration due to diffusion of metal atoms into the glass. Double or triple silver layers are frequently used as multilayers. A wide variety of low-E coatings are known, for example, from DE 10 2009 006 062 A1, WO 2007/101964 A1, EP 0 912 455 B1, DE 199 27 683 C1, EP 1 218 307 B1, and EP 1 917 222 B1.

The deposition of low-E coatings is preferably done by the method of magnetic field assisted cathode sputtering known per se. Layers deposited by magnetic field assisted cathode sputtering have an amorphous structure and cause clouding of transparent substrates such as glass or transparent polymers. A temperature treatment of the amorphous layers causes a crystal structure change all the way to a crystalline structure with improved transmittance. The temperature input into the coating can be done by a flame treatment, a plasma torch, infrared radiation, or a laser treatment.

WO 2008/096089 A2 discloses a method for deposition and temperature treatment of thin layers. The heating of a layer applied on a substrate inevitably also results in the heating of the substrate itself. The heat is drained out of the layer into the colder substrate in contact therewith. This creates a temperature gradient along the substrate, which causes thermal stresses, which can lead to breakage of the substrate. Such damage can be avoided by heating the layer to a maximum temperature of 300° C., while, simultaneously, the temperature on the opposite side of the glass is maintained at less than 150° C. The temperature treatment is done depending on the nature of the layer by a variety of methods, for example, a laser configuration is used for tempering a silver-containing multilayer. However, commercially available lasers can cover only a small region up to a few hundred millimeters. For this reason, a configuration is used that enables moving the laser perpendicular to the running direction of the conveyor belt with the substrate and thus covering the complete surface. However, the speed of a single laser is, particularly with large substrates, so small that the laser treatment cannot occur in-line with the coating of the substrate.

Another possibility for processing large area substrates would be a single laser optical system that covers the entire region of the substrate without changing its position. However, a single optical arrangement of this magnitude requires a complicated and expensive structure made of a plurality of optical components that must be adjusted individually.

Alternatively, a plurality of laser modules can be installed next to each other with each laser module covering a part of the substrate surface. However, a plurality of laser units installed next to each other necessitate precise adjustment such that precisely fitting coverage of the entire substrate width occurs.

From other areas of the art, laser methods for processing of large area substrates are already known. US 2007/0211323 A1 describes, for example, a laser device for producing OLEDs (organic light emitting displays), wherein a plurality of lasers are movably mounted on a bridge and the bridge can be moved on two guide rails in direction x and direction −x.

DE 196 20 391 A1 also discloses a bridge structure with a plurality of processing heads. Here again, movement of the bridge in direction x and −x is necessary. Such forward and backward driving of the bridge in direction x and −x is not consistent with temporally efficient laser processing of substrates on a conveyor belt, since, in this manner, only low absolute transport speeds can be obtained. U.S. Pat. No. 4,889,140 and US 2009/0212033 A1 disclose laser devices with a plurality of bridges that span a conveyor belt. However, only spot processing of the substrate occurs, large-area processing is neither intended nor possible.

None of these devices is suitable for the full-area tempering of low-E coatings of large area glass substrates in-line with the deposition of this low-E coating.

The object of the present invention is to provide a device that enables tempering of metal-containing or metal-oxide-containing coatings on large-area glass substrates in-line with a process for deposition of the coating, wherein, at the same time, simple adjustment of the laser module is ensured and the laser device should be as cost-effectively producible as possible.

The object of the present invention is accomplished according to the invention by a laser device for laser processing large-area glass substrates, a method for laser processing large-area glass substrates, and the use of the laser device for processing of metal-coated or metal-oxide-coated glass substrates according to independent claims 1 and 12 and 15. Preferred embodiments of the invention emerge from the subclaims.

The laser device for processing large-area planar glass substrates includes at least a plurality of laser sources, a plurality of optical arrangements, and at least two bridges that span a conveyor belt. The glass substrate to be processed is situated on the conveyor belt. Preferably, the size of the glass substrate corresponds to the standard format of 3 m×6 m customary for float glass, with the shorter edge of substrate positioned parallel to the bridges on the conveyor belt. Preferably, the laser device is situated at the end of a production line for deposition of a metal-containing or metal-oxide-containing coating on the glass substrates, wherein the laser processing can occur in-line with the coating. The optical arrangements are alternatingly mounted on the bridges. Each optical arrangement generates a laser line, and, together, the laser lines of all the optical arrangements cover the entire width of the glass substrate. The term "entire width of the glass substrate" refers to the maximum dimension of the substrate perpendicular to the transport direction of the conveyor belt.

In a preferred embodiment of the laser device according to the invention, two bridges are mounted transversely over the conveyor belt. The optical arrangements are alternatingly applied on the two bridges such that a first optical arrangement is mounted on the first bridge and the nearest optical arrangement thereto in the transverse direction is mounted on the second bridge. The next optical arrangement is again mounted on the first bridge. This alternating arrangement results in the fact that one more optical arrangement is situated on the second bridge than on the first bridge. Generally, the number of optical arrangements on the first bridge is n and on the second bridge is n+1, where n is a whole number greater than 1. Alternatively, the number of optical arrangements on the second bridge can be n with n+1 on the first bridge. Preferably, the total number of optical arrangements is 5 to 15, particularly preferably 10 to 12.

Another embodiment of the laser device according to the invention contains, in addition to the first and second bridge, a third bridge over the conveyor belt. The optical arrangements are alternatingly arranged on all three bridges. The first optical arrangement is mounted on the first bridge, the nearest optical arrangement transverse to the transport direction is mounted on another bridge, and the next optical arrangement is mounted on the thus far unoccupied bridge. The order of the three bridges is arbitrary. Preferably, the total number of optical arrangements is 5 to 15, particularly preferably 10 to 12. A laser device with three bridges is preferably used when the space requirement of the optical arrangements is so great that they can no longer be placed on two bridges.

The number of laser sources preferably corresponds to at least the number of bridges. The laser sources can in each case be mounted on the bridges immediately adjacent the optical arrangements or adjacent the bridges. The laser beam emitted from the laser source is guided by a mirror or a light guide to the optical arrangement. Alternatively, a single laser source can be used for all optical arrangements on all bridges.

When the laser sources are mounted immediately adjacent the optical arrangements auf der bridge, one laser source per optical arrangement is necessary. Preferably, in this case, the lasers are movably mounted on the bridges such that the position of the lasers can also be varied at the time of displacement of the optical arrangements. Thus, the adjustment of the lasers and of the optical arrangement at right angles to the transport direction of the conveyor belt is enabled. Alternatively, the lasers can also be stationarily mounted if the adjustment range of the optical arrangements is less than the distance between the optical arrangement and the laser source. In the case of a small distance between the laser source and the optical arrangement and an uninhibited beam path, the laser beam can be guided directly to the optical arrangement via a mirror. This is particularly advantageous when the laser sources are mounted directly adjacent the optical arrangements on the bridge.

In an alternative embodiment, only one laser source, which is attached adjacent the bridge or on the edge of the bridge, is needed per bridge. The laser beam is guided via a light guide, preferably a fiberglass cable, from the laser source to the optical arrangements.

The optical arrangements comprise at least one laser scanner, one lens, and one diaphragm. A polygonal scanner or a galvano scanner can be used as the laser scanner.

Preferably, a polygonal scanner is used as the laser scanner. The laser beam is first focused on the surface of the polygon by a lens. Only one lens with a small diameter is necessary, which is advantageous with regard to the costs of the laser device. The laser beam is focused by the lens to a width of approx. 50 µm. The diameter of the lens is, for example, 5 cm. The central component of the polygonal scanner is a movable polyhedral mirror prism that rotates at ca. 10,000 rotations per minute, and, in this manner, a line of the substrate is continuously scanned. The scan speeds obtained by the polygonal scanners used are greater than 10 meters per second, preferably 25 meters per second. Due to the high rotational speed of the mirror, a continuous homogeneous laser line is formed. The length of the laser line is determined by the number and the length of the facets of the polygonal mirror and its distance from the substrate surface. Preferably, optical arrangements that generate a laser line with a width of 100 mm to 1000 mm, preferably 200 mm to 400 mm, are used. This laser line is guided through a diaphragm that cuts the endpoints of the laser line and then strikes the surface of the substrate. The surface of the substrate is situated in the focal point of the laser line. The focus of the laser line can thus be adjusted via the distance of the optical arrangement from the substrate surface.

Alternatively, a galvanometer scanner can be used as the laser scanner. The mode of operation of the galvanometer scanner is similar to that of the polygonal scanners, with the galvanometer scanner having, however, only one mirror instead of the mirror prism. Thus, the maximum scanning speed of the galvanometer scanner, at 5 m per second, is substantially less than the speed of the polygonal scanner. The laser beam emitted by the laser source strikes the mirror of the galvanometer scanner directly and is guided from there to a lens that focuses the laser beam to a width of approx. 50 µm. A diaphragm that cuts the endpoints of the laser line is situated immediately behind the lens. With the selection of a galvanometer scanner with a scanning speed of 5 meters per second, the width of the laser line generated is limited to a maximum of 300 mm.

The distance of the optical arrangements from the surface of the substrate is preferably 10 cm to 100 cm, with the focusing of the laser line with the use of a polygonal scanner being done via the variation of this very distance. The optical arrangements are movable along the bridges at right angles to the transport direction of the conveyor belt, by which means a simple adjustment of the optical arrangements is ensured. The alternating arrangement of the optical arrangements on the bridges enables adjustment of the optical arrangements independent of each other since there is adequate space for displacement of the optical arrangements and they do not interfere spatially with each other. The optical arrangements are movable along the bridges by 1 cm to 20 cm, preferably 5 cm to 15 cm.

The laser lines of the individual optical arrangements add up to an illumination region that covers the entire width of the glass substrate. The laser lines of adjacent optical arrangements cover a shared substrate region of 500 µm to 1 cm, preferably 0.1 cm to 0.3 cm, which is illuminated by both laser lines. This overlapping of the process regions of the individual laser lines ensures that the complete surface of the glass substrate is covered and no gaps develop at the transition between two processing regions.

Preferably, the bridges have a distance between each other of 20 cm to 90 cm, preferably 40 cm to 60 cm.

Preferably, continuous wave lasers or pulsed solid-state lasers are used as laser sources. Particularly preferably, a neodymium-doped yttrium-aluminum-granite laser (Nd:YAG laser) is used. Alternatively, ytterbium (Yb:YAG laser) or erbium (Er:YAG laser) can be used as doping materials, or titanium:sapphire lasers or neodymium-doped yttrium-vanadate lasers (Nd:YVO$_4$ laser) can be used. The Nd:YAG laser emits infrared radiation with a wavelength of 1064 nm. However, by frequency doubling or frequency tripling, radiation of the wavelengths 532 nm and 355 nm can be generated.

The laser processing is done with a wavelength of 300 nm to 1300 nm. The wavelength used depends on the type of coating. The wavelength of the laser radiation must fall within a range in which the coating absorbs it and can thus be heated by the energy input. The Nd:YAG laser preferably used can provide laser radiation of the wavelengths 355 nm, 532 nm, and 1064 nm. For the processing of silver coatings, a wavelength of 1064 is preferably used.

The total power required for the laser processing depends greatly on the design of the optical arrangements, the structure of the system, and the beam guidance of the laser beam. Typical power values are between 1 kW and 16 kW.

The laser power must also be adapted to the layer thickness, the layer structure, and the composition of the coating.

The invention further includes a method for continuous laser processing of large-area planar glass substrates with the laser device according to the invention. In a first step, the optical arrangements are adjusted along the bridges such that, together, they cover the entire width of the substrate. Preferably, the regions of the individual optical arrangements overlap each other by 500 μm to 1 cm, preferably 0.1 cm to 0.3 cm. In a second step of the method according to the invention, the speeds of the conveyor belt and the laser scanner are synchronized. This synchronization ensures uniform processing of the surface with product quality randomly checked by measuring electrical resistance and transmittance. The transmittance value should increase uniformly in all regions by laser processing, whereas the electrical resistance drops. Alternatively, the checking of the coating can also be done manually as the laser tracks are readily discernible visually.

Then, the glass substrates are placed on the conveyor belt. Preferably, the laser processing of the glass substrates is done just after the deposition of a coating, with both processes running in-line. According to the process of the invention, the speed of the laser processing is at least equal to the speed of the coating process such that a deceleration of the conveyor belt as in the conventional method according to the prior art is unnecessary here. The conveyor belt preferably has a speed from 5 m to 15 m per minute, particularly preferably 9 m to 11 m per minute. In the last step of the process, the substrates pass through the bridges and are processed nonstop by means of the laser arrangements mounted on the bridges. The laser scanners do not have to be turned off during the transition between glass substrates and even in the case of a large gap appearing between two glass substrates.

The invention further includes the use of the laser device according to the invention for processing metal-coated or metal-oxide-coated glass substrates, particularly preferably large-area glass substrates with a width of 1 m to 6 m, preferably with a width of at least 3 m. The laser device according to the invention and the method according to the invention are particularly well-suited for processing glass substrates in the conventional standard float glass format of 3-meter width and 6-meter length.

The glass substrates used contain soda lime glass, quartz glass, borosilicate glass, and/or transparent plastics such as polymethyl methacrylate. Float glass is preferably used.

The coating of the glass substrate preferably include metal layers or oxides such as TCO layers (transparent conductive oxide), for example, silver layers or ITO layers (indium tin oxide). Particularly preferably, a silver layer with a thickness from 6 nm to 15 nm surrounded by two barrier layers with a thickness from 0.5 nm to 2 nm containing nickel-chromium and/or titanium is used. Between a barrier layer and the glass surface, a diffusion barrier with a thickness from 25 nm to 35 nm containing $Si_3N_4$, $TiO_2$, SnZnO, and/or ZnO is preferably applied. On the upper barrier layer, facing the environment, a diffusion barrier with a thickness from 35 nm to 45 nm containing ZnO and/or $Si_3N_4$ is preferably applied. This upper diffusion barrier is optionally provided with a protective layer with a thickness from 1 nm to 5 nm comprising $TiO_2$ and/or $SnZnO_2$. The total thickness of all layers is preferably 67.5 nm to 102 nm.

In the following, the invention is explained in detail with reference to drawings. The drawings in no way restrict the invention.

They depict:

FIG. 1a a laser device according to the invention with two bridges over a conveyor belt.

Figure 1B:
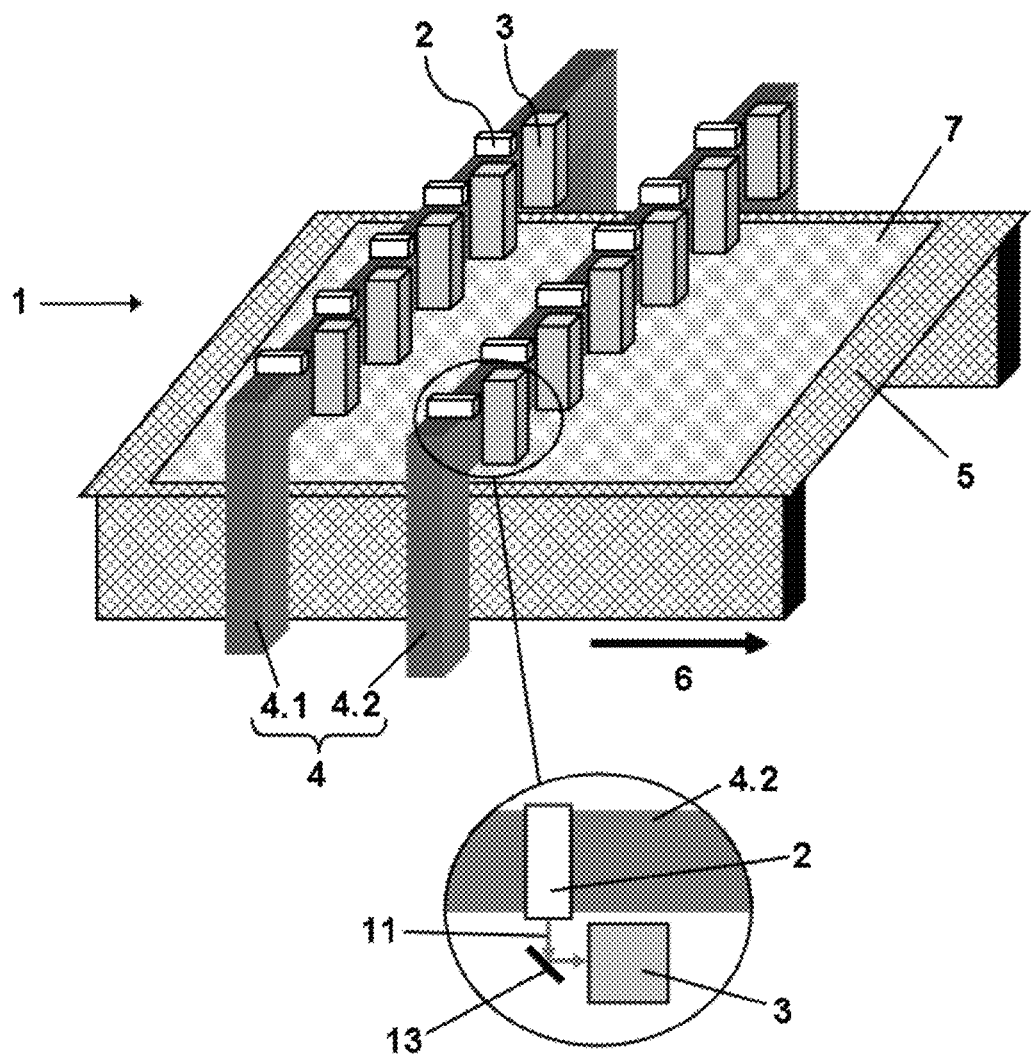

FIG. 1b the laser device according to the invention of FIG. 1a with detailed depiction of the beam path.

Figure 2:
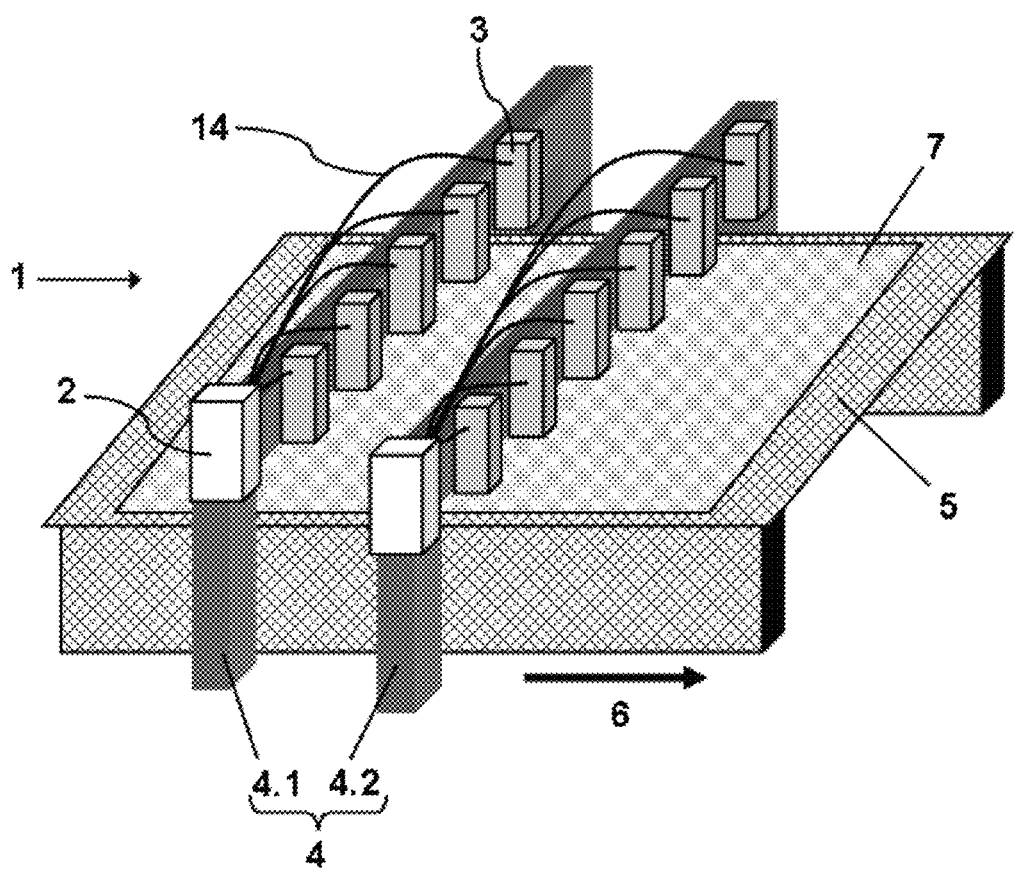

FIG. 2 another embodiment of the laser device according to the invention, wherein the laser beam is guided via light guides to the optical arrangements.

Figure 3:
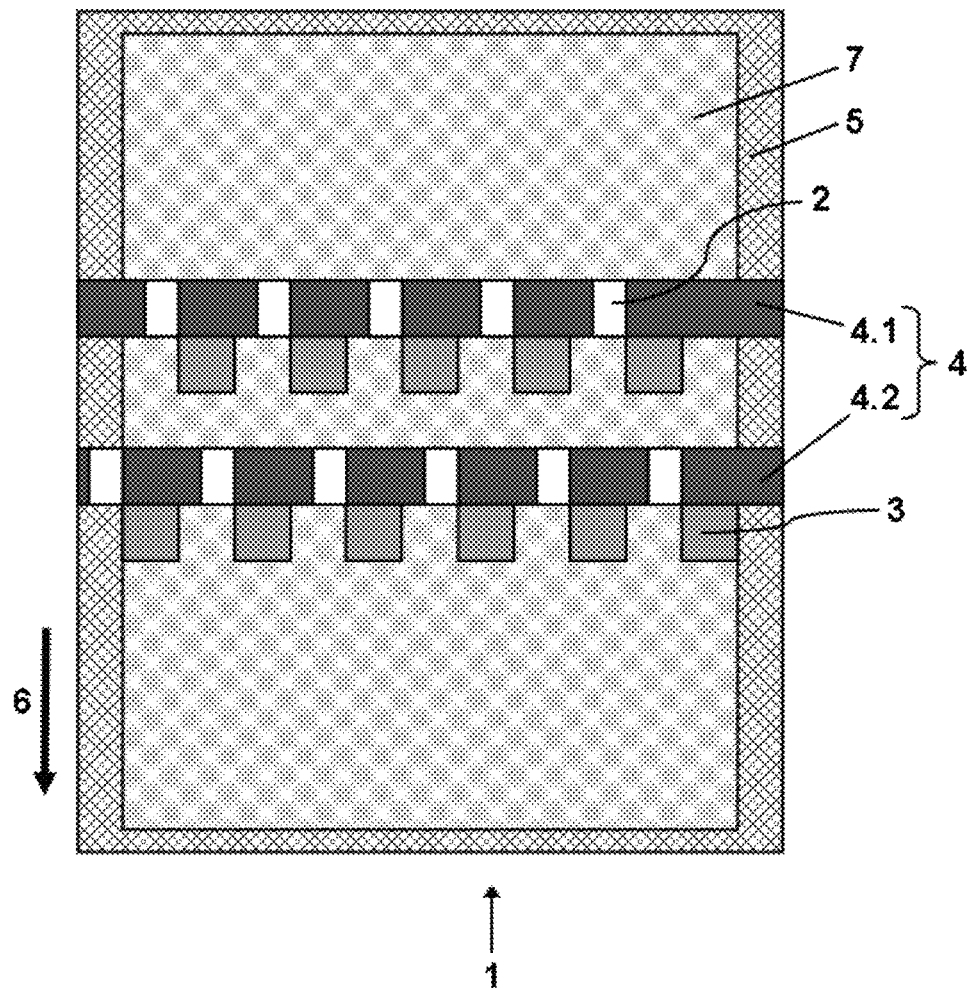

FIG. 3 a plan view of the laser device according to the invention of FIG. 1a.

Figure 4:
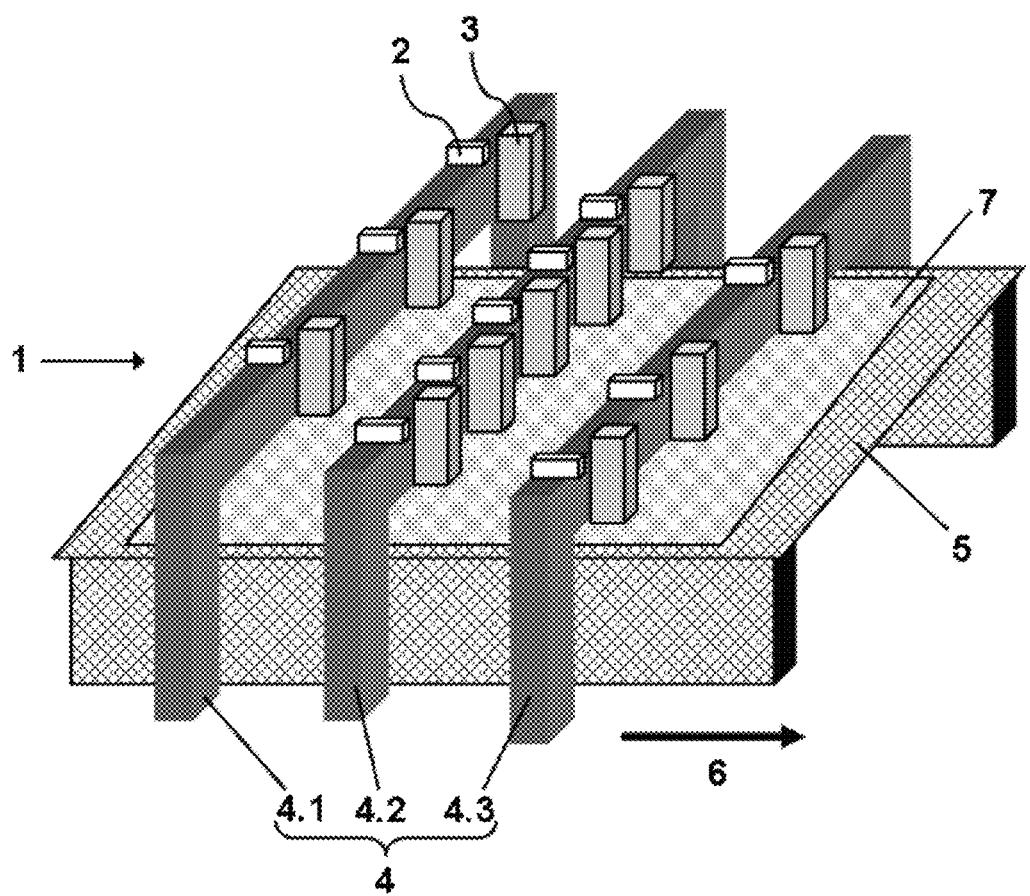

FIG. 4 an alternative embodiment of the laser device according to the invention with three bridges over a conveyor belt.

Figure 5:
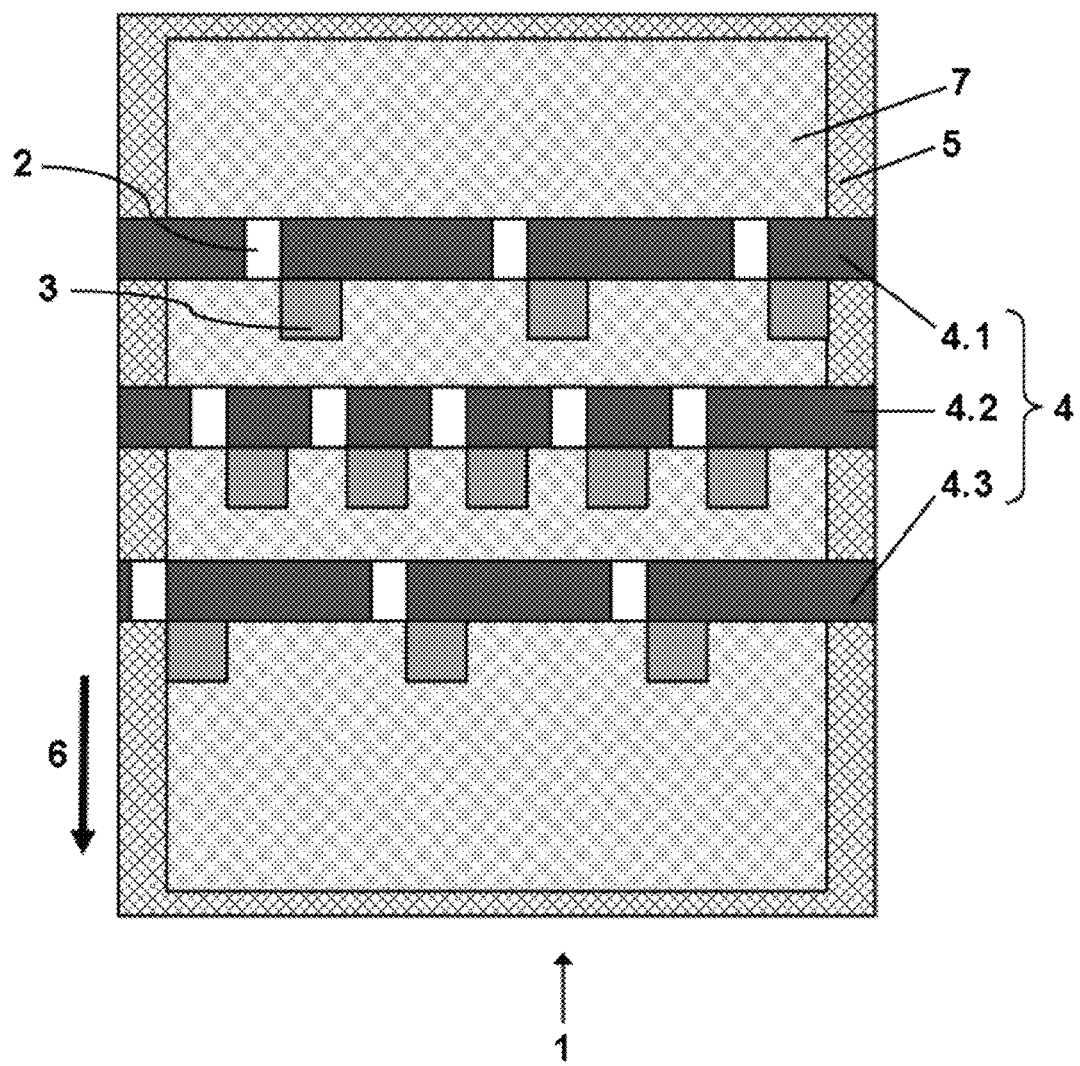

FIG. 5 a plan view of the laser device according to the invention of FIG. 4.

Figure 6:
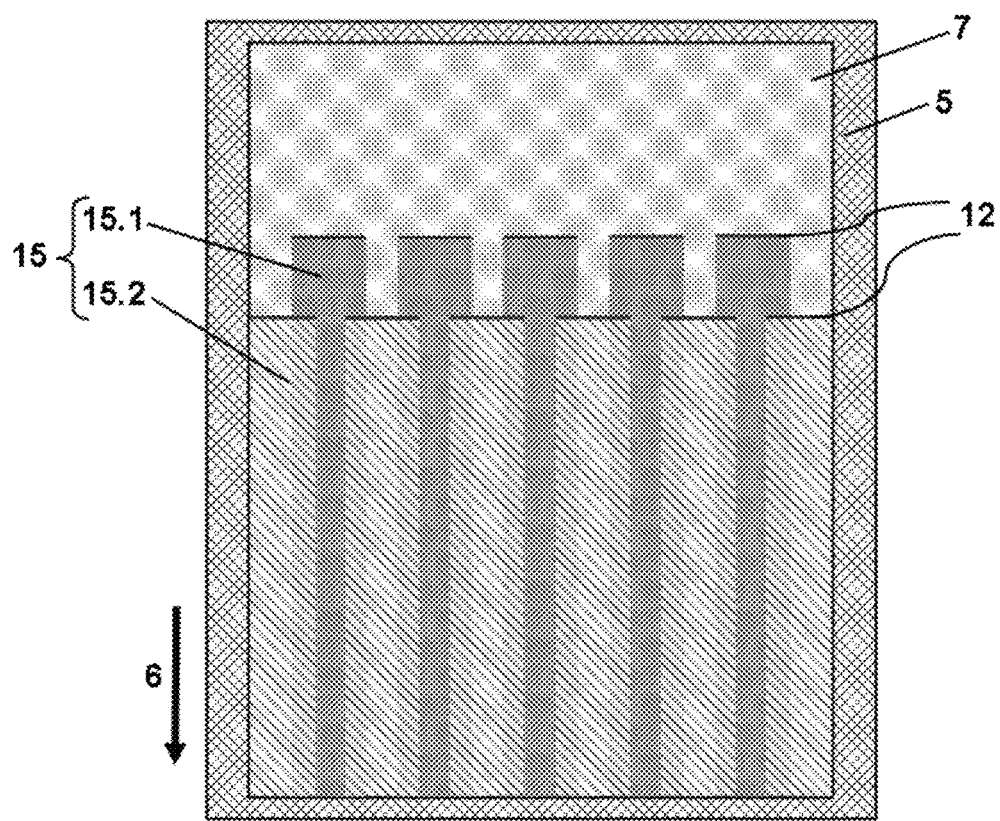

FIG. 6 the processing regions of the laser device according to the invention of FIG. 1a on a glass substrate.

Figure 7:
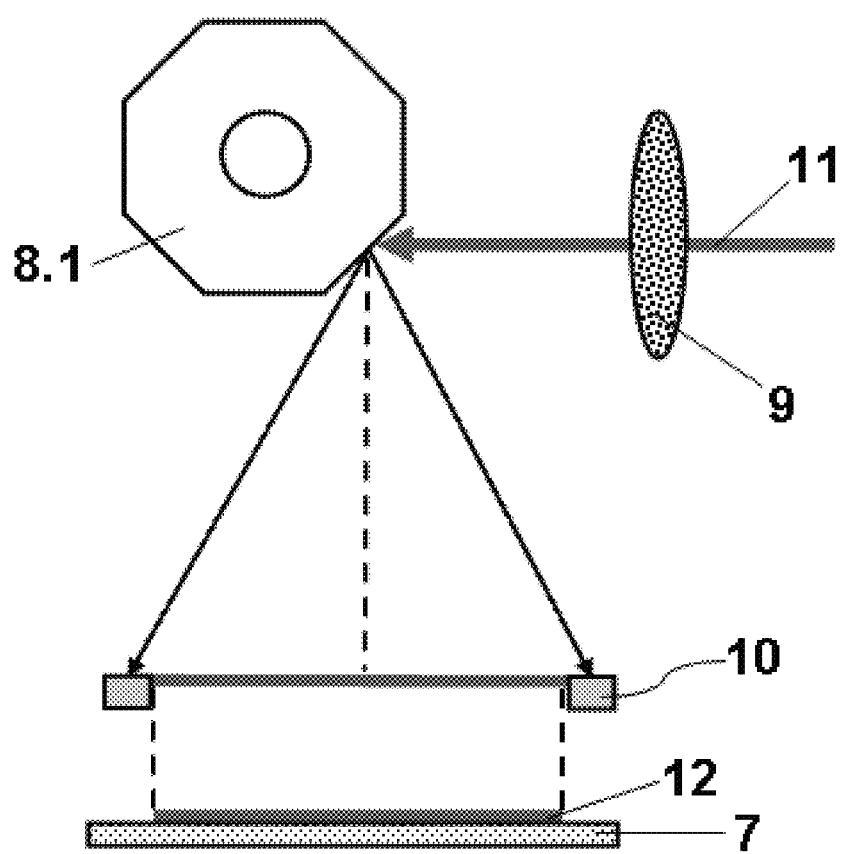

FIG. 7 a polygonal scanner used to generate the laser line.

Figure 8:
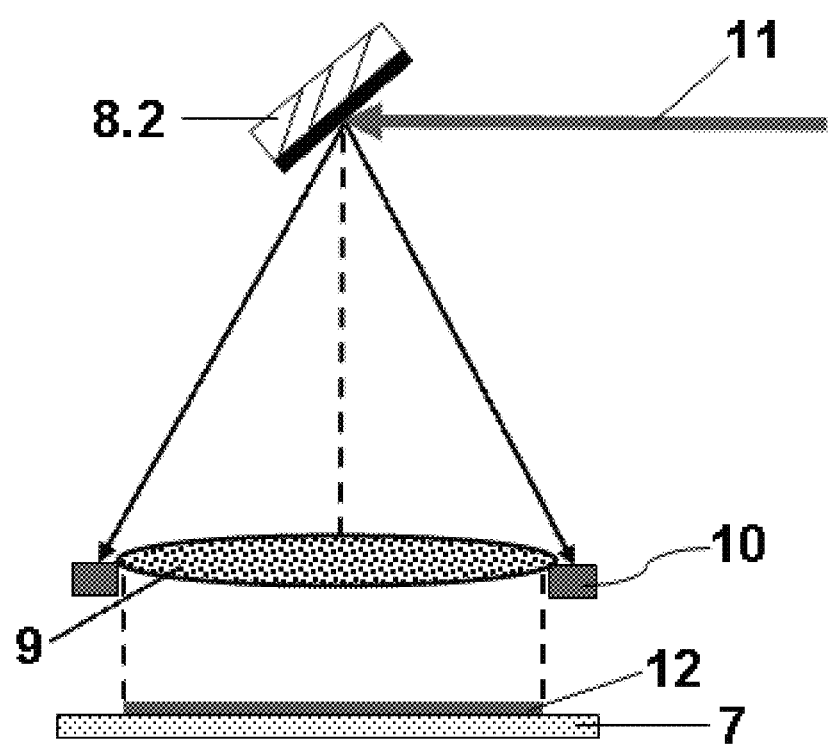

FIG. 8 a galvanometer scanner used to generate the laser line.

Figure 9:
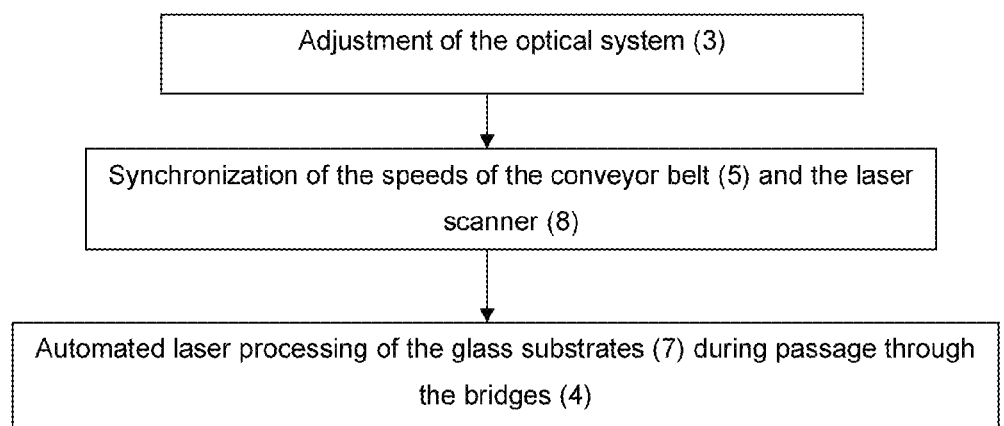

FIG. 9 a method according to the invention for laser processing of large-area substrates.

FIG. 1a depicts the laser device (1) according to the invention with two bridges (4) over a conveyor belt (5). The bridges (4) span the conveyor belt (5) at right angles to the transport direction (6). A glass substrate (7), which is transported through under the bridges (4) is positioned on the conveyor belt (5). Optical arrangements (3) are mounted on the first bridge (4.1) and the second bridge (4.2). In each case, one laser source (2) per optical arrangement (3) is situated on the bridges (4) near the optical arrangements (3). Five optical arrangements (3) with five laser sources (2) are installed on the first bridge (4.1), whereas six optical arrangements (3) and six laser sources (2) are mounted on the second bridge (4.2). The optical arrangements (3) are alternatingly mounted on the two bridges (4). This alternating arrangement of the optical arrangements (3) on the two bridges (4) ensures adequate space for the adjustment of the optical arrangements (3) along the bridges (4), since the distance between adjacent optical arrangements (3) is sufficiently large. For the processing of glass substrates (7) with a width of 3 meters, such a laser device (1) with a total of 11 optical arrangements (3), wherein each optical arrangement (3) generates a laser line with a 300-mm width and the glass substrate (7) is thus covered over its entire width, is preferably used FIG. 1b depicts the laser device (1) according to the invention of FIG. 1a, wherein the course of the laser beam (11) is depicted in detail. The laser beam (11) generated by a laser source (2) is guided via a mirror (13) to the adjacent optical arrangement (3) and enters it via a side opening in the housing. The laser source (2), the associated mirror (13), and the associated optical arrangement (3) are movably mounted on the bridges (4) such that the arrangement can readily be displaced along the bridges (4). The distance of the optical arrangement (3) from the surface of the glass substrate (7) is also variable, with the height of the laser source (2) and of the mirror (13) generally not needing to be changed. Depending on its configuration, a height adjustment of the optical arrangements (3) is necessary to ensure focusing on the surface of the glass substrate (7). However, since these are comparatively small height adjustments, the height of the mirror (13) and of the laser source (2) need not be changed; instead, the course of the laser beam (11) can be readjusted merely by rotating the mirror.

FIG. 2 depicts another embodiment of the laser device (1) according to the invention, wherein the laser beam (11) is guided via light guides (14) to the optical arrangements (3). The general structure corresponds to that depicted in FIG. 1a. Deviating therefrom, only one laser source (2), which is built on the edge of the bridge (4), is required per bridge (4). The laser beam is guided from the light sources (2) by a light guide (14) in each case to a respective optical arrangement (3). This embodiment offers the advantage of dispensing with mirrors for guidance of the laser beam and, thus, the readjustment of these mirrors with already small position changes of the optical arrangement (3) is eliminated. The light guide (14) used here has, in contrast, limited movement such that relatively small changes in the position of the optical arrangement (3) are within the tolerance range and require no readjustment at all.

FIG. 3 depicts a plan view of the laser device (1) according to the invention of FIG. 1a. The optical arrangements (3) are arranged in alternating sequence on the first bridge (4.1) and the second bridge (4.2). The processing regions of the optical arrangements (3) cover the glass substrate (7) over its complete width along the bridges (4).

FIG. 4 depicts an alternative embodiment of the laser device (1) according to the invention with three bridges (4) over a conveyor belt (5) with a glass substrate (7). Three optical arrangements (3) are alternatingly mounted on the first bridge (4.1); five optical arrangements (3), on the second bridge (4.2); and three optical arrangements (3), on the third bridge (4.3). The distribution of optical arrangements (3) on the bridges (4) is variable, with the only consideration being that, together, processing regions of the individual optical arrangements (3) cover the entire width of the glass substrate (7). In each case, one laser source (2) is mounted on the bridges (4) near the optical arrangements (3). However, alternatively, a reduction of laser sources is also conceivable with the use of light guide cables, as depicted in FIG. 2.

FIG. 5 depicts a plan view of the laser device (1) according to the invention of FIG. 4, wherein the alternating arrangement of the optical arrangements (3) on the three bridges (4) is discernible. On the first bridge (4.1) and the third bridge (4.3), three optical arrangements (3) are mounted in each case, whereas on the second bridge (4.2), five optical arrangements (3) are mounted. Each optical arrangement (3) covers a subregion of the glass substrate (7), with the individual regions of the optical arrangements (3), together, covering the total width of the glass substrate (7) in the region of the bridges (4).

FIG. 6 depicts the processing regions (15) of the laser device (1) according to the invention of FIG. 1a on the glass substrate (7). The laser lines (12) generated on the glass substrate (7) are guided by the movement of the conveyor belt (5) lengthwise over the glass substrate (7). This creates a plurality of processing regions (15) on the glass substrate (7), with the processing regions of the first bridge (15.1) located between the processing regions of the second bridge (15.2) and overlapping therewith. This overlapping ensures that no unprocessed regions are created. The glass substrate (7) is transported via the conveyor belt (5) in the transport direction (6) such that the surface of the glass substrate (7) is completely processed.

FIG. 7 depicts a polygonal scanner (8.1) used to generate a laser line (12). After entry into the optical arrangement (3), the laser beam (11) is focused by a lens (9) on an area of the polygonal scanners (8.1). The rotating polygonal scanner (8.1) reflects the laser beam (11) onto the surface of the glass substrate (7). By means of the rapid rotational movement of the polygonal scanners (11), a laser line (12) develops. The ends of the laser line (12) are cut by a diaphragm (10). The focusing of the laser line (12) on the surface of the glass substrate (7) is done by height adjustment of the polygonal scanner (8.1) relative to the substrate surface.

FIG. 8 depicts a galvanometer scanner (8.2) used to generate a laser line, which can, alternatively to a polygonal scanner (8.1), be included as the laser scanner (8) in the optical arrangements (3). The laser beam (11) enters the housing of the optical system (3) and is a guided by a galvanometer scanner (8.2) to a lens (9). Through rotation, the galvanometer scanner (8.2) generates a laser line (12), which is focused by the lens on the surface of the glass substrate (7). The lens (9) is fitted into a diaphragm (10) that cuts ends of the laser line (12). The length of the laser line is limited by the size of the lens.

FIG. 9 depicts a method according to the invention for laser processing large-area glass substrates (7). In a first step, the adjustment of the optical arrangements (3) to the width of the glass substrate (7) is done. The optical arrangements (3) are oriented such that the glass substrate (7) can be processed over its full width and the processing regions (15) of the individual optical arrangements (3) overlap partially. Next, the speeds of the conveyor belt (5) and the laser scanner (8) are synchronized. The method according to the invention enables faster processing of glass substrates (7) than the methods known from the prior art, since the optical arrangements (3) are mounted stationarily and do not have to be moved during the process. Thus, the laser processing according to the method according to the invention can preferably occur right after the coating of the substrate (7) by sputtering, without the speed of the conveyor belt (5) having to be cut back. In the next step, the glass substrates (7) are placed on the conveyor belt (5). In an in-line arrangement of a coating system and the laser device (1) according to the invention, the glass substrates (7) are already placed on the conveyor belt (5) upstream of the coating system. Then, the glass substrate (7) on the conveyor belt (5) pass through the bridges (4) and are automatically processed by the optical arrangements (3).

In the following, the invention is illustrated in detail with reference to one example of the method according to the invention and one comparative example.

In two series of experiments, the maximum achievable speeds of the conveyor belt (5) and the costs of all optical components were compared with laser processing of a large-area glass substrate (7) using the laser device (1) according to the invention and using a laser device known according to the prior art. In all experiments, the dimensions of the glass substrates (7) used were 3 meters in width and 6 meters in length. The glass substrates (7) were placed on the conveyor belt (5) with the long side edge parallel to the transport direction (6) of the conveyor belt (5). The laser device (1) according to the invention and the laser device according to the prior art were used in each case in-line with a coating system with the glass substrates (7) processed using the laser devices directly after the deposition of the coating. A magnetron sputtering system was used as the coating system, in which, in this series, a 30-nm-thick $Si_3N_4$ layer, a 10-nm-thick silver layer, a 1-nm-thick nickel-chromium layer, a 40-nm-thick ZnO layer, and a 4-nm-thick $TiO_2$ layer were applied on the substrate surface. Directly after deposition, the silver layer had an amorphous structure. The transition from the amorphous structure into a crystalline structure was accomplished by tempering the coating, by which means the transparency of the coating is improved. Laser methods have proved to be particularly well-suited for such temperature treatments. In experimental series, the laser devices for tempering the coating were arranged directly adjacent the coating system such that a direct further treatment of the glass substrates occurred. The laser process is usually the slowest step of the method. Thus, an acceleration of the laser process is accompanied by an acceleration of the complete production process and the associated cost savings. On the other hand, the costs for the laser arrangement should be kept as low as possible. The maximum possible speeds of the conveyor belt in the processing of the glass substrates with the laser device according to the invention and a laser device according to the prior art as well as the acquisition costs of the optical components of the laser devices were compared on the basis of the experimental series.

A) EXAMPLE 1

Processing Large-Area Glass Substrates (7) Using the Laser Device (1) According to the Invention Two bridges (4) were installed 50 cm apart over the conveyor belt (5), which span the conveyor belt (5) parallel to the short side edge of the glass substrates (7) positioned thereon. Five optical arrangements (3) were mounted on the first bridge (4.1), whereas six more optical arrangements (3) were installed on the second bridge alternatingly to the optical arrangements (3) of the first bridge (4.1). The optical arrangements (3) were oriented such that the diaphragm (10), through which the laser line (12) exits, points in the direction of the glass substrate (7). A laser source (2) is laser beam (11) was guided to the optical arrangements (3) by light guides (14) was positioned on the edge of each bridge (4). The laser beam (11) entered the optical arrangement (3) through a side opening and was guided there by a lens (9) onto a polygonal scanner (8.1). The polygonal scanner (8.1) rotated at 10,000 revolutions per minute and thus generated a continuous laser line (12), which was reflected onto the glass substrate (7). The polygonal scanner (8.1) used had a scanning speed of 10 m per second. The ends of the laser line (12) were cut by the passage of the laser line (12) through the diaphragm (10). The optical arrangements (3) were adjusted such that the processing regions (15) of the optical arrangements (3) adjacent in the transverse direction (3) on the glass substrate (7) overlap in each case by 0.2 cm. Neodymium-doped yttrium-aluminum-granite lasers (Nd:YAG laser) were used as laser sources.

B) COMPARATIVE EXAMPLE 2

Processing Large-Area Glass Substrates (7) with a Laser Device Known According to the Prior Art In Comparative Example 2, the processing of the large-area glass substrates (7) was done with the laser device of the company Innovavent sold under the name "Volcano Line Beam 750 Laser Optics". An Nd:YAG laser (Starlase 400G US) with a wavelength of 532 nm was used.

Table 1 shows the maximum possible speeds of the conveyor belt (5) as well as the costs of all optical components for the laser device (Example 1) according to the invention and the laser device known according to the prior art (Comparative Example 2).

TABLE 1

|  | Maximum speed of the conveyor belt | Acquisition costs of the optical components |
| --- | --- | --- |
| Example 1 | Up to 15 m per min. | <500k€ |
| Comparative Example 2 | <10 m per min. | >1000k€ |

The laser device (1) according to the invention enables a significant speed increase of the conveyor belt (5). In the case of the sputtering process operating in-line with the laser processing, transport speeds of 10 m per minute were achieved. In the subsequent processing of the glass substrate (7) with the laser known according to the prior art, the speed of the sputtering process is not achieved; as a result, the substrates have to be stored temporarily and cannot be further processed directly in-line. The laser device (1) according to the invention accelerates the laser processing in that a direct further processing of the glass substrates (7) is possible without intermediate storage. The complete production process is thus accelerated, which results in a reduction in production costs. Moreover, the laser device (1) according to the invention has a substantially simpler structure compared to the complex optical arrangement of the laser device according to the prior art. As can be seen in Table 1, the acquisition costs of the optical components compared to the known laser device can be reduced by more than 50%. Furthermore, the laser device (1) according to the invention enables a simple adjustment of the optical arrangements (3), since they are alternatingly mounted on the bridges (4) and thus do not interfere with each other and can be moved independently of each other.

LIST OF REFERENCE CHARACTERS 1 laser device
2 laser sources
3 optical arrangements
4 bridges
4.1 first bridge
4.2 second bridge
4.3 third bridge
5 conveyor belt 6 transport direction
7 glass substrate
8 laser scanner
8.1 polygonal scanner
8.2 galvanometer scanner
9 lens
10 diaphragm
11 laser beam
12 laser line
13 mirror
14 light guide
15 processing regions
15.1 processing region of the first bridge
15.2 processing region of the second bridge

The invention claimed is:

1. A laser device for tempering metal-containing or metal-oxide-containing coatings on large-area glass substrates comprising:
   a) at least one laser source,
   b) at least two bridges spanning a conveyor belt with the glass substrate,
   wherein
   each bridge contains a plurality of optical arrangements, which are alternatingly arranged on the at least two bridges,
   each optical arrangement is movable along the at least two bridges by 1 cm to 20 cm,
   each optical arrangement generates a laser line at a fixed position at which the each optical arrangement is arranged on the bridge,
   the laser lines of all optical arrangements together cover the entire width of the substrate so as to temper the complete surface of the glass substrate as the glass substrate moves through the conveyor belt, and
   the laser lines of adjacent optical arrangements form an overlap region with a width of 500 µm to 1 cm.

2. The laser device according to claim 1, wherein a first bridge and a second bridge are arranged over the conveyor belt and the number of optical arrangements on the first bridge is n and the number of optical arrangements on the second bridge is n+1 or vice versa.

3. The laser device according to claim 1, wherein a first bridge, a second bridge, and a third bridge are arranged over the conveyor belt.

4. The laser device according to claim 1, wherein the number of laser sources corresponds to at least the number of the bridges.

5. The laser device according to claim 1, wherein the optical arrangements include at least one laser scanner, one lens, and one diaphragm.

6. The laser device according to claim 1, wherein the laser scanner is a polygonal scanner or a galvanometer scanner.

7. The laser device according to claim 1, wherein the laser beam is guided via a mirror or a light guide from the laser source to the optical arrangement.

8. The laser device according to claim 1, wherein the distance of optical arrangements from the surface of the glass substrate is 10 cm to 100 cm and the optical arrangements are movable along the bridges at right angles to the transport direction of the conveyor belt by 1 cm to 20 cm.

9. The laser device according to claim 8, wherein the optical arrangements are movable along the bridges at right angles to the transport direction of the conveyor belt by 5 cm to 15 cm.

10. The laser device according to claim 1, wherein the bridges have a distance of 20 cm to 90 cm between them.

11. The laser device according to claim 10, wherein the bridges have a distance of 40 cm to 60 cm between them.

12. The laser device according to claim 1, wherein the laser lines of adjacent optical arrangements together cover a region with a width of 0.1 cm to 0.3 cm.

13. The laser device according to claim 1, wherein solid-state lasers are used as a laser source.

14. The laser device according to claim 1, wherein neodymium-doped yttrium-aluminum-granite lasers (Nd:YAG lasers), ytterbium-doped yttrium-aluminum-granite lasers (Yb:YAG lasers), erbium-doped yttrium-aluminum-granite lasers (Er:YAG lasers), titanium:sapphire lasers, or neodymium-doped yttrium-vanadate lasers (Nd:YVO4 lasers) are used as a laser source.

15. The laser device according to claim 1, wherein the at least two bridges are exactly two bridges.

16. A method of using the laser device of claim 1, comprising:
   processing metal-coated or metal-oxide-coated glass substrates,
   wherein the laser device comprises at least one laser source and at least two bridges spanning a conveyor belt with the glass substrate, and
   wherein each bridge contains a plurality of optical arrangements alternatingly arranged on the at least two bridges, each optical arrangement generating a laser line at a fixed position at which the each optical arrangement is arranged on the bridge, and the generated laser lines together cover the entire width of the substrate.

17. A method for continuous laser processing of a large-area glass substrate with a laser device according to claim 1, the laser device having at least one laser source, the method comprising:
   adjusting optical arrangements of the laser device such that the laser lines of adjacent optical arrangements overlap each other on the glass substrate by 500 µm to 1 cm,
   synchronizing the speeds of a conveyor belt and a laser scanner of the laser device, and
   automated laser processing during passage of the glass substrates on the conveyor belt under at least two bridges spanning the conveyor belt with the glass substrate,
   wherein a plurality of the optical arrangements are alternatingly arranged on the at least two bridges, each of the plurality of the optical arrangements generating a laser line at a fixed position at which the each optical arrangement is arranged on the bridge, and the generated laser lines together cover the entire width of the glass substrate.

18. The method according to claim 17, wherein the conveyor belt-moves at a speed of 5 m to 15 m per minute.

* * * * *